United States Patent
Alvey

(10) Patent No.: US 10,181,832 B1
(45) Date of Patent: Jan. 15, 2019

(54) MULTIMODE TRANSMIT POWER CONTROL LOOP, ELECTRONIC DEVICE, AND METHOD OF ADJUSTING A DETECTED OPERATING LEVEL OF AMPLIFIED POWER OUTPUT

(71) Applicant: Motorola Mobility LLC, Chicago, IL (US)

(72) Inventor: Graham Alvey, Oak Park, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 15/726,180

(22) Filed: Oct. 5, 2017

(51) Int. Cl.
| | |
|---|---|
| *H03G 3/30* | (2006.01) |
| *H04B 7/005* | (2006.01) |
| *H04L 25/03* | (2006.01) |
| *H03F 1/02* | (2006.01) |
| *H04W 52/22* | (2009.01) |
| *H04B 1/04* | (2006.01) |

(52) U.S. Cl.
CPC ......... *H03G 3/3042* (2013.01); *H03F 1/0272* (2013.01); *H04B 7/005* (2013.01); *H04L 25/03267* (2013.01); *H04W 52/228* (2013.01); *H03F 2203/7212* (2013.01); *H04B 2001/0416* (2013.01)

(58) Field of Classification Search
CPC .... H03G 3/3042; H03F 1/0272; H04B 7/005; H04L 25/03267; H04W 52/228
USPC ....................................................... 323/265
See application file for complete search history.

(56) References Cited

U.S. PATENT DOCUMENTS

| | | | | |
|---|---|---|---|---|
| 4,467,288 | A * | 8/1984 | Strickland | H03F 3/3001 330/149 |
| 6,324,230 | B1 * | 11/2001 | Graham | H03G 3/3052 375/345 |
| 7,218,951 | B2 * | 5/2007 | Rozenblit | H03F 1/0272 455/126 |
| 7,991,367 | B2 * | 8/2011 | Pratt | H04W 52/52 455/114.3 |
| 8,559,896 | B2 * | 10/2013 | Trump | H03G 3/3042 455/114.3 |

* cited by examiner

*Primary Examiner* — Yemane Mehari
(74) *Attorney, Agent, or Firm* — Lawrence J. Chapa

(57) ABSTRACT

The present application provides a multimode transmit power control loop, an electronic device, and a method of adjusting a detected operating level of amplified power output from a power amplifier. The multimode transmit power control loop including a feedback path wherein a feedback path signal is coupled to a feedback detection input of the power amplifier via the feedback path. The feedback path includes a mode selection switch having a control input for selectively applying a different impedance circuit to the feedback path for switching in different attenuation levels, based upon the control input of the mode selection switch identifying one or more of multiple potential operating modes. Operation of the multimode transmit power control loop increases or decreases an operating level of amplified power output from the power amplifier, which is proportional to a present level of attenuation resulting from the particular impedance circuit being applied to the feedback path via the mode selection switch.

20 Claims, 5 Drawing Sheets

MULTIMODE TRANSMIT POWER CONTROL LOOP, ELECTRONIC DEVICE, AND METHOD OF ADJUSTING A DETECTED OPERATING LEVEL OF AMPLIFIED POWER OUTPUT

FIELD OF THE APPLICATION

The present application relates generally to the feedback adjustment of the output of a power amplifier, and more particularly, where a particular one of multiple different impedances are applied to the feedback path dependent upon one of multiple operating modes being detected, where the operating level of the amplified power output of the power amplifier is dependent upon the particular one of the different impedances and corresponding level of attenuation being applied to the feedback path.

BACKGROUND

Wireless communications has enabled the possibility to communicate information over long distances, where the use of a wired connection would be impractical. However wireless communications often involve the transmission of energy into the public airwaves, which can then be detected by a receiving device. The airwaves being considered a public resource is often regulated by the government to help avoid conflicting uses. This includes frequent allocation by the government of portions of the airwaves to particular users and uses that have been deemed to be beneficial.

Initially the wireless spectrum was more widely used for one way broadcast type communications including broadcast radio and television, where different portions or channels within the available spectrum would often be reserved for a particular broadcaster. Multiple listening devices could tune into the reserved channel for a particular broadcaster and receive the signal being currently transmitted. Broadcasting/transmitting devices would preferably be restricted to their reserved channel and would need to avoid transmitting into the spectrum space within which they were not authorized to operate.

However systems soon developed that enabled multiple users to communicate within a particular shared spectrum space. The corresponding communications often included two way communications, which tended to be more private, and/or were intended to be restricted to a fewer number of devices. Communication systems developed that would support multiple more private communication connections, that often apportioned the allotted spectrum into still smaller chunks, which could each be used and/or be temporarily assigned to support each of the more private communication connections. A desirable signal for one particular communication connection is generally considered undesirable noise relative to all other coexisting communication connections. In order to support as many private communication connections as possible, it is often beneficial for devices to be able to operate within their allotted space while minimizing their impact into the non-allotted portions of the spectrum.

As such, it is common for devices that are intended to be used in a shared system of communication to undergo testing, such as electromagnetic compatibility testing, so as to help insure that they will operate within a system as intended while attempting to reduce the negative impact to other devices similarly operating within the system. Testing may also be used to help determine if the devices might stray from their allotted spectrum space, and/or if so, to help insure that the devices do not significantly impact in a negative way other portions of the airwaves that the devices are not intended to operate.

Correspondingly, a device may undergo testing from regulatory bodies, standards bodies, and/or other industry groups. Some of the testing can take the form of and/or include radiated tests, which includes the transmission and detection of a radiated signal. Some of the same or other tests can include a conducted test, which allows for the signals, which are intended to be transmitted, to be monitored prior to being wirelessly transmitted. For example, a conducted test can sometimes include a port that can be used to monitor the signal prior to being conveyed to a radiating structure, such as an antenna. As such, a device may support both the conveyance of a communication signal via a radiating structure, as well as a wired port.

Regulatory test can sometimes require both conducted and radiated tests of electromagnetic compatibility to make sure that a device is not transmitting spurious emissions into a protected band. Standard bodies, being more concerned with the interoperability of the device with corresponding network infrastructure may focus more on conducted testing, for purposes of determining compliance with their specifications. Other industry groups may focus on other forms of testing that can include initial radiated testing to verify a design, as well as a subsequent more widely applied conducted testing of power for a statistical check relative to the overall mass production distribution of a device.

The present inventors have recognized that in order to better manage the functionality of the communication signal conveyance that might take multiple forms, such as forms including one or both wired (i.e. conducted) and wireless (i.e. radiated), that it would be beneficial to incorporate a feedback structure that would enable the feedback loop to take into account the different forms and/or modes of operation of the device, so as to allow control of the power level of the signal to be better managed. In at least some instances the feedback path can be conditioned to enable the signals being fed back for at least some of the different modes to appear the same or similar relative to the circuitry, which is intended to respond to the feedback signal.

SUMMARY

The present application provides a multimode transmit power control loop for a power amplifier. The multimode transmit power control loop includes a feedback path wherein a feedback path signal is coupled to a feedback detection input of the power amplifier via the feedback path. The feedback path includes a mode selection switch having a control input for selectively applying a different impedance circuit to the feedback path for switching in different attenuation levels, based upon the control input of the mode selection switch identifying one or more of multiple potential operating modes. Operation of the multimode transmit power control loop increases or decreases an operating level of amplified power output from the power amplifier, which is proportional to a present level of attenuation resulting from the particular impedance circuit being applied to the feedback path via the mode selection switch.

In at least some instances, at least one of the multiple potential operating modes that can be identified through the control input of the mode selection switch includes a mode identifying a wired connection to the amplified power output from the power amplifier.

In at least some instances, at least one of the multiple potential operating modes that can be identified through the control input of the mode selection switch includes a mode identifying an unobstructed antenna connection to the amplified power output from the power amplifier.

In at least some instances, at least one of the multiple potential operating modes that can be identified through the control input of the mode selection switch includes a mode identifying an obstructed antenna connection to the amplified power output from the power amplifier.

In at least some instances, at least one of the multiple potential operating modes that can be identified through the control input of the mode selection switch includes a mode identifying a device being charged to the amplified power output from the power amplifier.

The present application further provides an electronic device. The electronic device includes a transmitter for conveying a signal. The transmitter includes a power amplifier having a multimode transmit power control loop comprising a feedback path wherein a feedback path signal is coupled to a feedback detection input of the power amplifier via the feedback path. The feedback path includes a mode selection switch having a control input for selectively applying a different impedance circuit to the feedback path for switching in different attenuation levels, based upon the control input of the mode selection switch identifying one or more of multiple potential operating modes. The operation of the multimode transmit power control loop increases or decreases an operating level of amplified power output from the power amplifier, which is proportional to a present level of attenuation resulting from the particular impedance circuit being applied to the feedback path via the mode selection switch.

The present application still further provides a method of adjusting a detected operating level of amplified power output from a power amplifier. The method includes detecting one or more of multiple potential operating modes. A different impedance circuit is then selectively applied to a feedback path of a multimode transmit power control loop dependent upon the one or more potential operating modes detected for switching in a different attenuation level. The operation of the multimode transmit power control loop increases or decreases an operating level of amplified power output from the power amplifier, which is proportional to a present level of attenuation resulting from the particular impedance circuit being applied to the feedback path via a mode selection switch.

These and other objects, features, and advantages of the present application are evident from the following description of one or more preferred embodiments, with reference to the accompanying drawings.

DETAILED DESCRIPTION OF THE PREFERRED EMBODIMENT(S)

Figure 1:
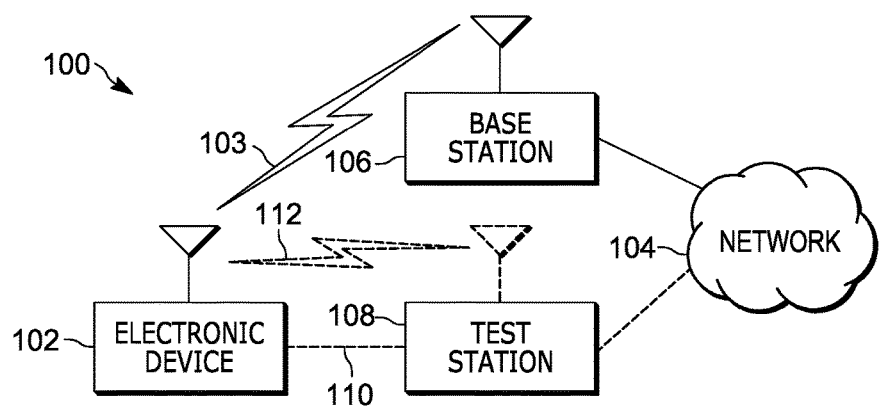
FIG. 1 is a block diagram of an exemplary network environment in which the present invention might operate.

While the present application is susceptible of embodiment in various forms, there is shown in the drawings and will hereinafter be described presently preferred embodiments with the understanding that the present disclosure is to be considered an exemplification and is not intended to be limited to the specific embodiments illustrated.

FIG. 1 illustrates a block diagram of an exemplary network environment 100 in which the present invention might operate. More specifically, the network environment 100 can include an electronic device 102 having wireless communication capabilities, where the electronic device 102 can communicate wirelessly 103 with a network 104 within the exemplary environment, such as via one or more base transceiver stations 106. Within at least some network environments, base transceiver stations 106 can be arranged so as to provide communication coverage relative to respective geographical regions, sometimes referred to as cells. In other instances the communications with the electronic device relative to a network may be more peer-to-peer and/or ad-hoc, and may include other electronic devices, peripherals and/or accessories with wireless communication capabilities.

In at least some instances, the electronic device 102 could include a radio telephone, such as a cellular telephone. The electronic device 102 could also additionally and/or alternatively include other types of devices, such as a personal digital assistant (PDA), a cordless telephone, a tablet, a netbook, a laptop or portable computer, a selective call receiver, a gaming device, a digital music storage and/or playback device, as well as any other form of an electronic device that might benefit from wireless communications with another device and/or a network 104.

The network 104, in at least some instances, can include various public, private and personal networks, packet data and/or circuit switched networks, as well as various wide-area and local-area networks. The various communication connections between the different devices and/or network elements can additionally involve one or more different communication standards. At least a couple of examples of different communication standards include Global System for Mobile Communications (GSM) Code Division Multiple Access (CDMA), Orthogonal Frequency Division Multiple Access (OFDMA), Long Term Evolution (LTE), Global Positioning System (GPS), Bluetooth®, Wi-Fi (IEEE 802.11), Near Field Communication (NFC), Internet/Intranet (TCP/IP), Internet of Things (JOT), as well as various other communication standards. In addition, the electronic device 102 may utilize a number of additional various forms of communication including systems and protocols that support a communication diversity scheme, as well as carrier aggregation and simultaneous voice and data signal propagation.

In order to help insure that the electronic device will operate properly, a particular design and/or device can undergo testing to help insure that the device including the wireless communication capabilities will behave within the network environment in a manner in which it is intended. In at least some instances, the testing may occur separate from the network environment where the operation of the electronic device is observed relative to a test station 108.

In at least some instances, a particular test station 108 during testing may couple to the electronic device 102 via a wired connection 110. Additionally and/or alternatively, the test station 108 may couple to the electronic device 102 via a wireless connection 112. In some instances, the wired connection will correspond to a port in the transmission path of a signal to be transmitted prior to the signal being received at the tuner and a radiating element of a transmitter or transceiver. In some instances, testing via a wired connection will better isolate and/or better focus on the portion of the signal that is of interest relative to the test. This may be the case where the performance of the tuner or the radiating element is of less concern, and the information of interest is present in the transmission path prior to those elements.

Still further in some instances, the test station 108, in addition to being coupled to the electronic device being tested, may also be coupled to and/or may be a part of the network 104.

Figure 2:
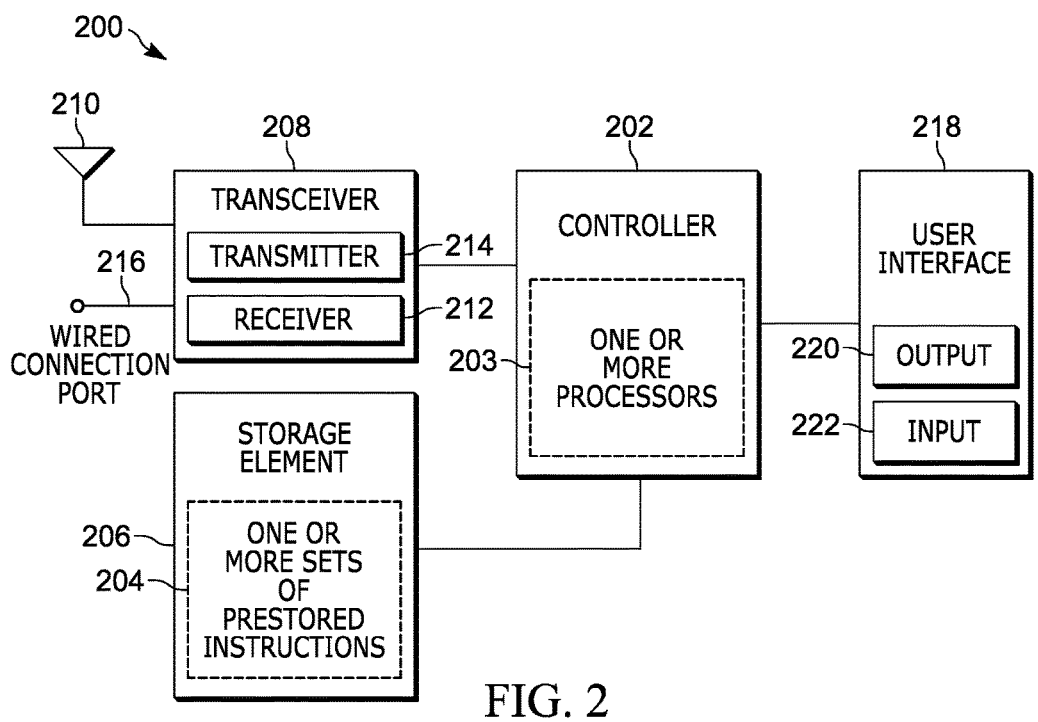
FIG. 2 is a block diagram of an exemplary electronic device, according to a possible embodiment.

FIG. 2 illustrates a block diagram 200 of an exemplary electronic device 102, according to a possible embodiment. In the illustrated embodiment, the exemplary electronic device 102 includes a controller 202, which is adapted for managing at least some of the operation of the device 102. In some embodiments, the controller 202 could be implemented in the form of one or more processors 203, which are capable of executing one or more sets of pre-stored instructions 204, which may be used to form or implement the operation of at least part of one or more controller modules including those used to manage wireless or wired communication. The one or more sets of pre-stored instructions 204 may be stored in a storage element 206, which while shown as being separate from and coupled to the controller 202, may additionally or alternatively include some data storage capability for storing at least some of the prestored instructions for use with the controller 202, that are integrated as part of the controller 202.

The storage element 206 could include one or more forms of volatile and/or non-volatile memory, including conventional ROM, EPROM, RAM, or EEPROM. The possible additional data storage capabilities may also include one or more forms of auxiliary storage, which is either fixed or removable, such as a hard drive, a floppy drive, or a memory stick. One skilled in the art will still further appreciate that still further forms of storage elements could be used without departing from the teachings of the present disclosure. In the same or other instances, the controller 202 may additionally or alternatively incorporate state machines and/or logic circuitry, which can be used to implement at least partially, some of the modules and/or functionality associated with the controller 202.

In the illustrated embodiment, the device further includes a transceiver 208, which is coupled to the controller 202 and which serves to manage the external communication of data including their wireless communication using one or more forms of communications. In such an instance, the transceivers will generally be coupled to an antenna 210 via which the wireless communication signals will be radiated and received. For example, the transceiver 208 might include a receiver 212, which supports the receipt of one or more communication signals, and a transmitter 214, which supports the transmission of one or more communication signals.

In some instances, the transmitter 214 and receiver 212 will work together to support bidirectional forms of communication. In other instances, the transmitter 214 and receiver 212 can each separately support respective unidirectional forms of communication. While the transmitter 214 and receiver 212 can work with an antenna 210 to radiate and receive wireless forms of signaling, in at least some exemplary embodiments, a wired connection port 216 may be available for transmitting and receiving the signaling to be conveyed via a conductive wired connection without being converted into a wireless form.

In the illustrated embodiment, the device 100 can additionally include user interface circuitry 218, some of which can be associated with producing an output 220 to be perceived by a user, and some of which can be associated with detecting an input 222 from the user. For example, the user interface circuitry 218 can include a display that produces a visually perceptible output, which may further support a touch sensitive array for receiving an input from the user. The user interface circuitry 218 may also include a speaker for producing an audio output, and a microphone for receiving an audio input. The user interface output 220 could further include a vibrational element. The user interface input 222 could further include one or more user actuatable switches, one or more sensors, as well as one or more cameras. Still further alternative and additional forms of user interface elements may be possible without departing from the teaching of the present application.

Figure 3:
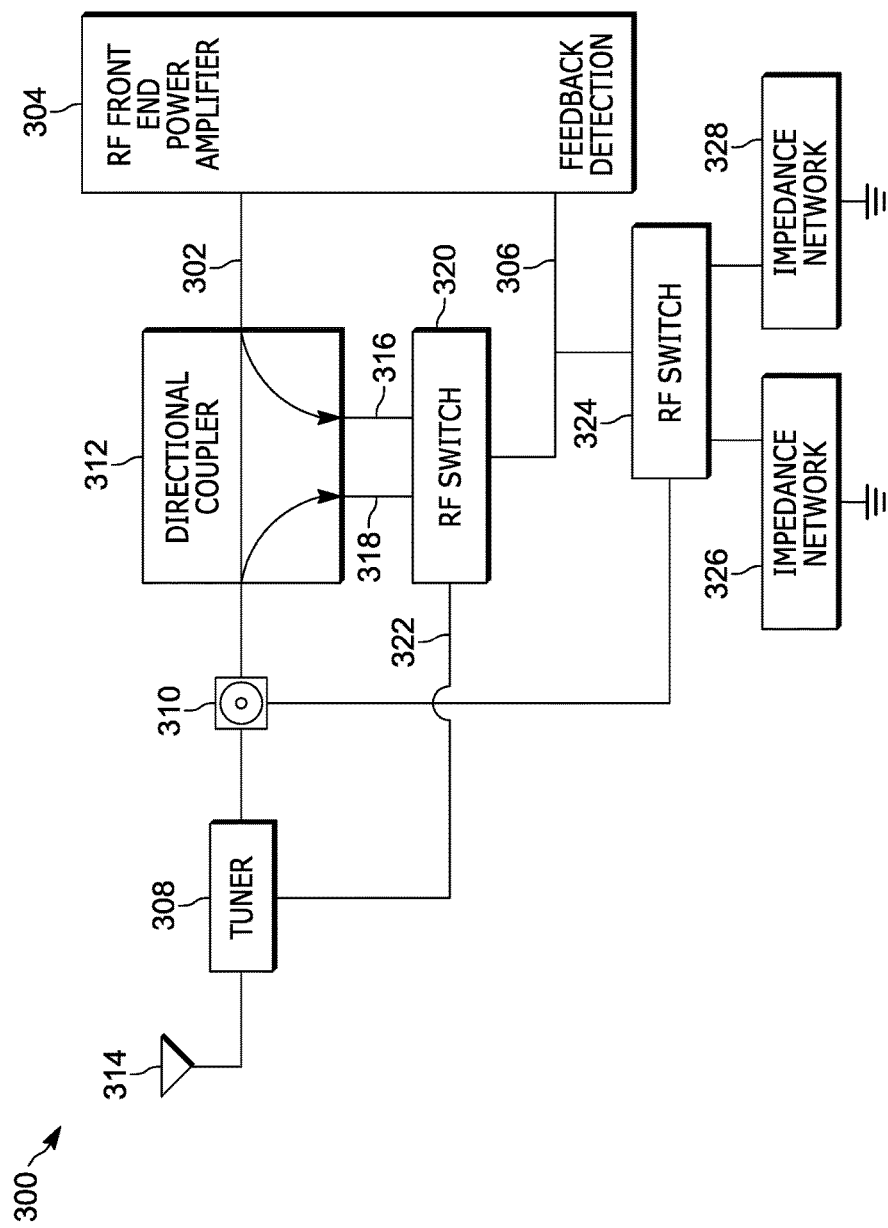
FIG. 3 is a block diagram of an exemplary multimode transmit power control loop, according to a possible embodiment.

FIG. 3 illustrates a block diagram 300 of an exemplary multimode transmit power control loop, according to a possible embodiment. In at least some instances, the multimode transmit power control loop could be part of the transmitter circuitry 214 of a transceiver 208. In the illustrated embodiment, the multimode transmit power control loop extends from a power amplifier output 302 included as part of radio frequency (RF) front end circuitry 304, and follows a path that returns to the radio frequency front end circuitry 304 via a feedback detection terminal 306. In turn, the radio frequency front end circuitry 304 can make operational adjustments so as to affect the value of the actual operating power output 302 of the power amplifier, based upon the detected value of the signal being monitored at the feedback detection terminal 306.

Dependent upon a detected degree of attenuation of the signal, the operation of the feedback loop can cause an increase or a decrease in the actual operating power output of the power amplifier. The increase or decrease in the actual operating power output can be generally proportional to a change in attenuation experienced by the signal when traversing the power control loop. By selectively coupling different impedance values to the feedback loop different levels of attenuation can be produced.

In the particular embodiment illustrated, the output 302 of the power amplifier is coupled to a tuner 308 and a wired connection terminal 310 via a directional coupler 312. The tuner 308 in turn is coupled to a radiating structure, such as an antenna 314. In some instances the wired connection terminal 310 can function like a headphone jack, where when a cable (i.e. jack plug) is connected to the wired connection terminal 310, a switch in the wired connection terminal 310 will interrupt the connection between output 302 of the power amplifier and the tuner 308 in favor of a wired connection between the output 302 of the power amplifier and the cable plugged into the wired connection terminal 310. In absence of a wired connection to the wired connection terminal 310, the output 302 of the power amplifier is coupled to the tuner 308.

The directional coupler 312 produces two outputs a first output 316 having a value, which is representative of the actual power output level of the power amplifier, and a second output 318 having a value, which is representative of the of the amount of power being reflected back from the tuner 308, the antenna 314, and/or the wired connection terminal 310. A radio frequency (RF) switch 320 alternatively allows either the signal representative of the actual power output level of the power amplifier at the first output 316 of the directional coupler 312, or the signal representative of the amount of power being reflected back at the second output 318 of the directional coupler 312 to be coupled to the feedback path 306. A select signal 322 of the RF switch 320 is coupled to the tuner, which in turn causes a selection between the two terminals of the RF switch 320, thereby managing which one of the signals, that are respectively coupled to the two terminals, is coupled to the feedback path 306. In at least one embodiment, the value of the select signal 322 of the RF switch 320 can be indicative of whether the tuner 308 is active or not, where the RF switch 320 causes the signal representative of the amount of power being reflected back to be coupled to the feedback path 306, when the tuner 308 is active. Conversely, the signal representative of the power output level of the power amplifier is coupled to the feedback path, when the tuner 308 is not active. However, it is possible that the tuner 308 could use an alternative selection criterion for controlling which one of the two signals is currently being coupled to the feedback path 306, which might allow the tuner 308 to alternatively select when the actual power output of the power amplifier or the reflected power would be being monitored.

A further radio frequency (RF) switch 324 is used to further selectively couple one of two potential impedance networks 326 and 328 to the feedback path 306, which in turn will impact the degree to which a signal being conveyed along the feedback path 306 might be further attenuated. The selection is managed by a select signal 330 coupled to the wired connection terminal 310. In at least some instances, the select signal 330 from the wired connection terminal 310 is related to the switch in the wired connection terminal 310, which can identify when a cable is connected to the wired connection terminal 310. In such an instance, impedance network 326 could be coupled to the feedback path 306, when a cable is connected to the wired connection terminal 310. Impedance network 328 could alternatively be coupled to the feedback path 306, when there is no cable connected to the wired connection terminal 310. This could allow the particular impedances to be selected, so that when a cable is connected to the wired connection terminal 310, the feedback detection circuit of the RF front end circuitry 304 appears to behave similar to if the antenna/tuner are present and operating. In at least some instances, the impedance network 326 is an open circuit (i.e. infinite or maximum impedance), which minimizes any affect on the corresponding attenuation of the signals being conveyed via the feedback path. The impedance network 328, as noted, applies an impedance that more closely matches the circumstances in which the antenna/tuner are present and operating, relative to the feedback path 306. The impedance network 328 could include a series resister connection to ground. Other components, including further resistors, capacitors and inductors could additionally and/or alternatively be included in the impedance network including some components that might make the degree of attenuation dependent upon the frequency of any signal present on the feedback path.

While a single RF switch 324 is shown in FIG. 3 for selectively coupling up to two alternative impedance networks to the feedback path 306, it is also possible that other forms of selection circuitry could be used to manage the selective application of one or more impedance networks to the feedback path 306. Still further, it is possible that still further detectable modes of operation of the electronic device 102 could be used to control if and/or when the various impedance networks are selectively coupled to the feedback path 306. Examples of additional detectable modes that could be used to control the application of various impedance networks include a determination as to whether the device is coupled to a main power source and correspondingly might have a portable power source in the process of being charged, or a determination as to whether the antenna is operating in a mode which is generally obstructed or unobstructed. An obstructed antenna might include the presence of a user's hand or another at least somewhat conductive element that might be selectively more proximate to the antenna 314, which in turn can have a potentially transient effect on the antenna's operating characteristics or impedance. In some cases multiple detectable modes could simultaneously coexist, that might dictate the desirability of a still further impedance network being coupled to the feedback path 306.

Figure 4:
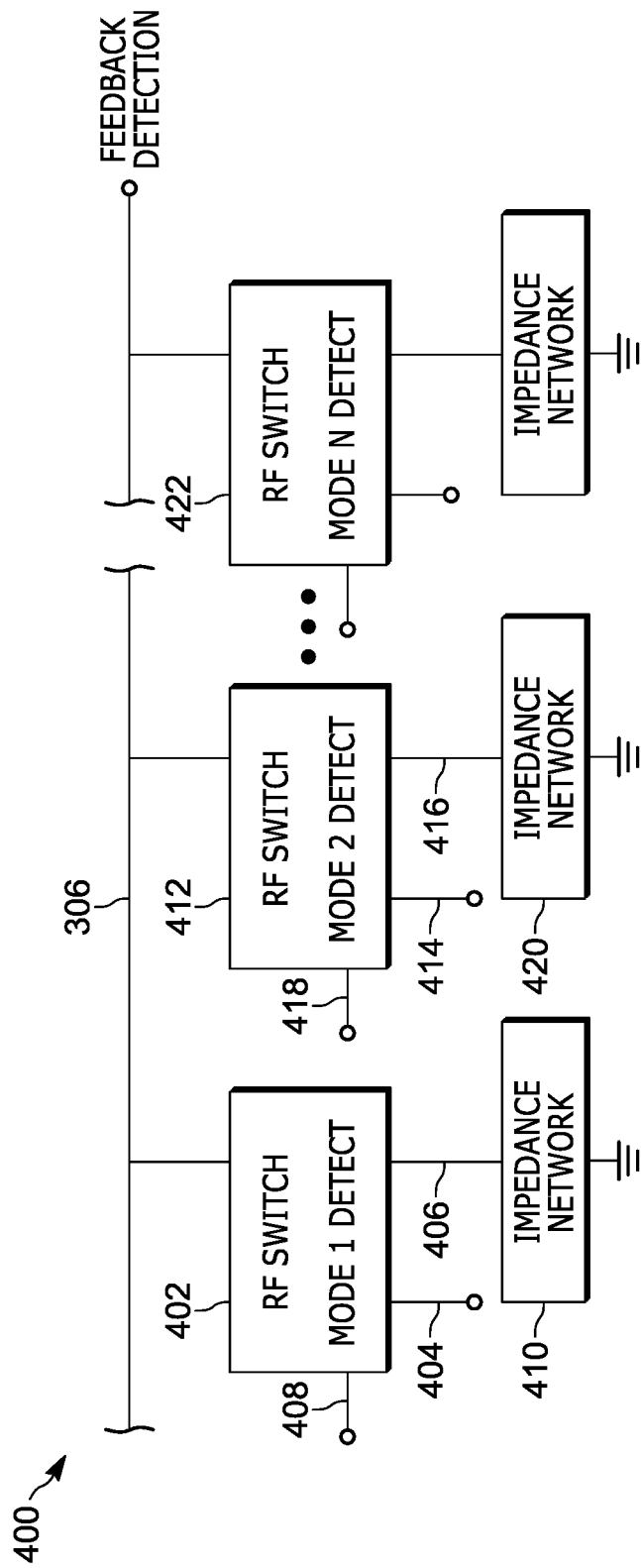
FIG. 4 is a block diagram including the selective application of one or more impedances to a feedback path of a power control loop, according to a possible embodiment.

FIG. 4 illustrates a block diagram 400 including the selective application of one or more impedances to a feedback path of a power control loop, according to a possible embodiment. Whereas, the example illustrated in FIG. 3 focused more on a circuit for the selective application of a potential pair of impedance network, based upon a single mode selection criterion, the example illustrated in FIG. 4 extends the selection criteria to potentially include multiple different mode selection criteria, and correspondingly increases the number of potentially different impedance networks that could be selectively applied to the feedback path 306. In the illustrated embodiment, multiple RF switches are coupled to the feedback path 306 in parallel. Each RF switch can selectively apply one of up to two different impedance networks to the feedback path 306.

For example, a first RF switch 402 could alternatively select between coupling two different terminals 404 and 406, each of which may be coupled to a different impedance network, based upon the value of the mode 1 detect input 408. In the illustrated embodiment terminal 404 is associated with an open circuit, and terminal 406 is associated with an impedance network 410. A second RF switch 412 alternatively selects between a further open circuit terminal 414, and a terminal 416 coupled to impedance network 420, based upon the value of mode 2 detect input 418. Any number of RF switches could be used to selectively apply one or more different impedance networks to the feedback path 306, each potentially dependent upon a different mode detect selection input, up to an Nth RF switch 422. Such a configuration may be well suited where multiple different modes are alternatively anticipated, where the associated impedance network is coupled to the feedback path, when the corresponding mode is detected. Otherwise, the corresponding RF switch could present an open circuit to the feedback path 306, thereby minimizing its effect on any corresponding feedback path attenuation.

Figure 5:
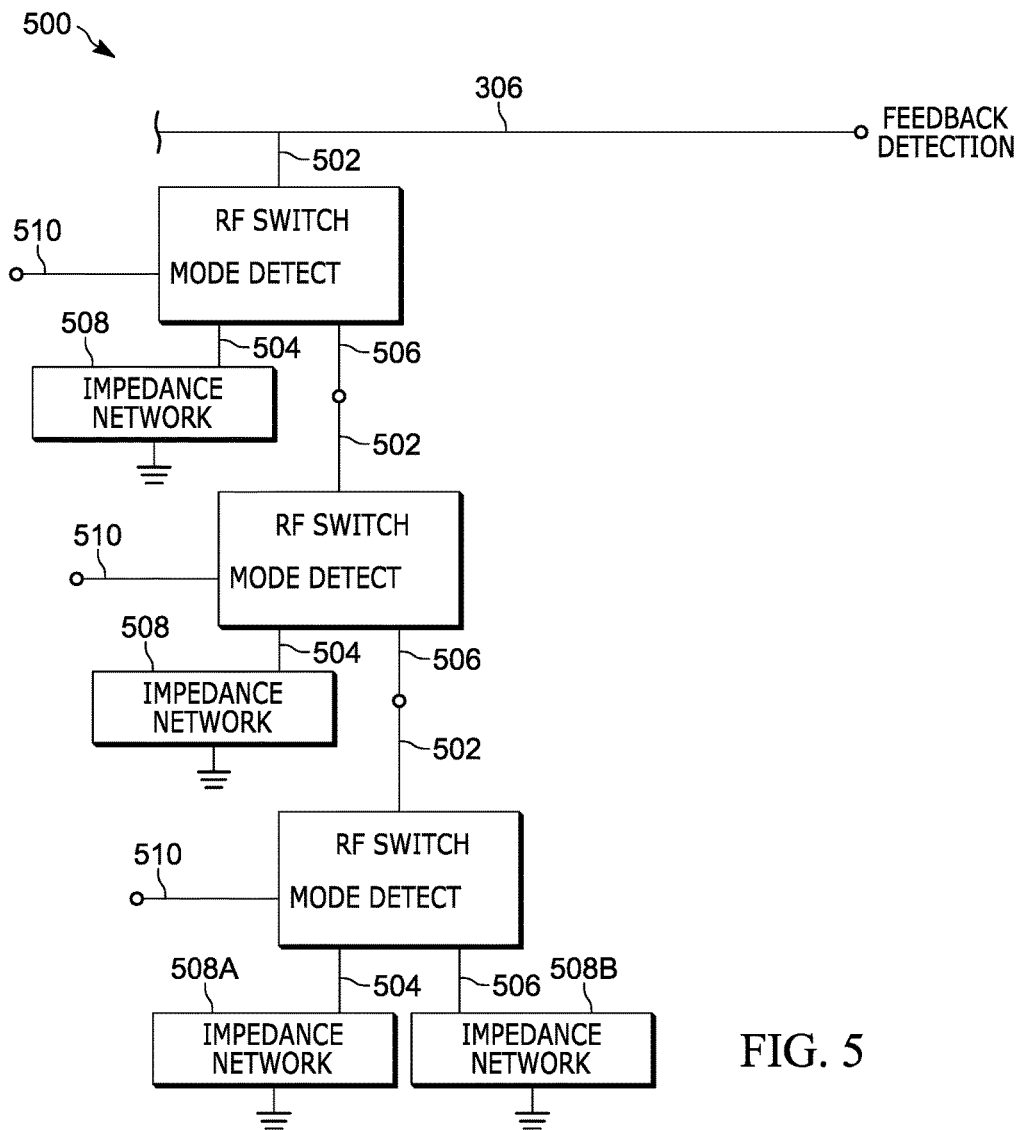
FIG. 5 is a block diagram including the selective application of one or more impedances to a feedback path of a power control loop, according to a further possible embodiment.

While FIG. 4 illustrates multiple RF switches in parallel for selectively coupling different impedances to the feedback path, various other configurations are possible. For example, a set of RF switches could be coupled in a cascading pattern in addition to or alternative to the RF switches in parallel. FIG. 5 illustrates a block diagram 500 including the selective application of one or more impedances to a feedback path of a power control loop, according to a further possible embodiment. An example of a cascading pattern is illustrated in FIG. 5, where a common terminal 502 of successive RF switches are coupled to one 506 of the alternatively selected terminals 504 and 506 of a preceding RF switch. The other alternatively selected terminal 504 of the respective RF switch is coupled to an impedance network 508. While the last RF switch in the cascading pattern shows the possibility of alternative selectable impedance networks 508A and 508B, at least one of the alternatively selected terminals could be associated with an open circuit having minimal if any impact on an attenuation associated with the feedback path. In each instance, a respective mode select terminal 510 will dictate which one of the alternatively selected terminals 504 or 506 is coupled to the corresponding common terminal 502 within the respective RF switch.

In some instances, a cascading configuration can be used to give priority to one form of mode selection over other forms of mode selection, where if a higher priority mode is identified as being active, then it might make moot the status of the other modes that might be also being monitored. For example, a particular determination for the highest priority mode selection associated with the first RF switch in the cascading pattern might result in a first impedance network being coupled to the feedback path 306, and the remaining RF switches and any corresponding impedance networks being decoupled from the feedback path 306.

Figure 6:
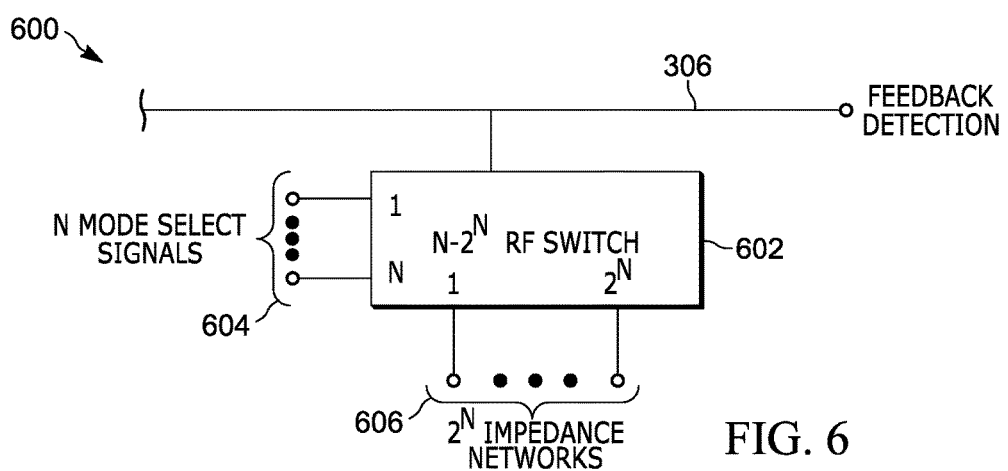
FIG. 6 is a block diagram including the selective application of one or more impedances to a feedback path of a power control loop, according to a still further possible embodiment.

FIG. 6 illustrates a block diagram 600 including the selective application of one or more impedances to a feedback path of a power control loop, according to a still further possible embodiment. In the embodiment illustrated in FIG. 6, the possibility of an RF switch with is capable of selecting between more than two alternative ports is provided. More specifically, an N-to-$2^N$ RF Switch 602 is illustrated, such as a 3-to-8 RF Switch. In such an instance, N mode detect select signals 604 can be used to select between $2^N$ different select terminals 606, which can each be associated with a respective impedance network. Correspondingly, each respective impedance network can help to produce a respective level of attenuation relative to the feedback path, which in turn can be used to affect the power output level of the power amplifier. While it is possible that each terminal could be associated with a different impedance network, it is also possible that some of the impedance networks can produce a similar effect. In some instances, one or more of the terminals may be associated with an open circuit, or an impedance network which does not produce a respective path to ground.

Figure 7:
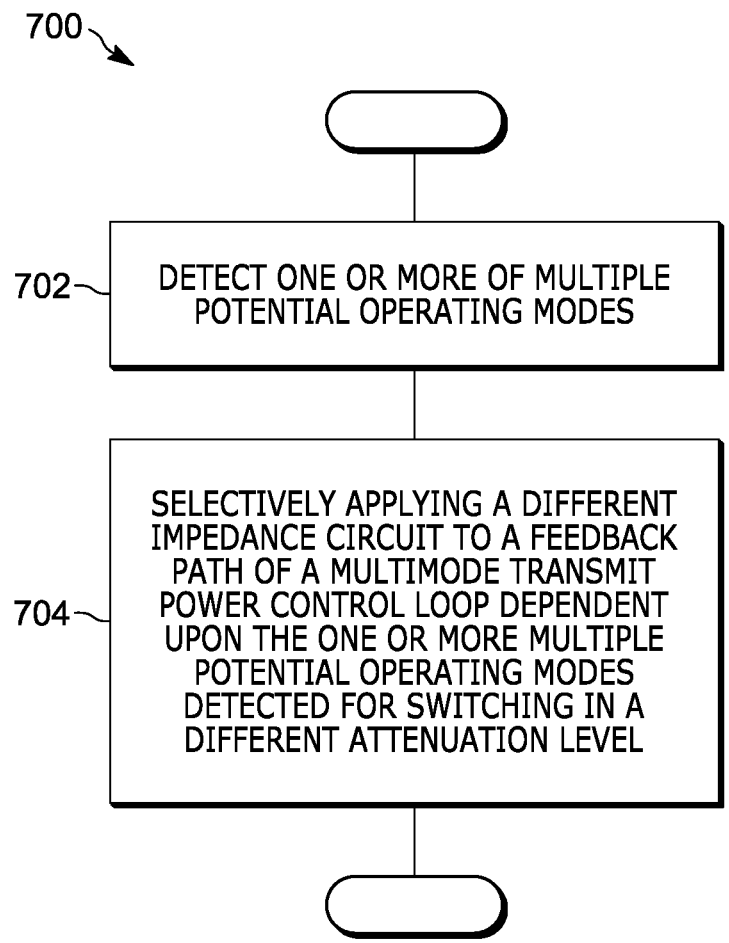
FIG. 7 is a flow diagram of a method of adjusting a detected operating level of amplified power output from a power amplifier, according to a possible embodiment.

FIG. 7 illustrates a flow diagram 700 of a method of adjusting a detected operating level of amplified power output from a power amplifier, according to a possible embodiment. The method includes detecting 702 one or more of multiple potential operating modes. A different impedance circuit is selectively applied 704 to a feedback path of a multimode transmit power control loop dependent upon the one or more potential operating modes detected for switching in a different attenuation level. Operation of the multimode transmit power control loop increases or decreases an operating level of amplified power output from the power amplifier, which is proportional to a present level of attenuation resulting from the particular impedance circuit being applied to the feedback path via a mode selection switch.

In at least some instances, the multiple potential operating modes can include a wired connection mode, which can be detected. The multiple potential operating modes can additionally and/or alternatively include an unobstructed antenna connection mode or an obstructed antenna mode, which can be detected. The multiple potential operating modes can still further additionally and/or alternatively include a device charging mode, which can also be detected.

In some instances, multiple operating modes may be simultaneously active, where the corresponding combination may result in a corresponding impedance network being coupled to the feedback path that takes into account both detected operating modes.

While the preferred embodiments have been illustrated and described, it is to be understood that the application is not so limited. Numerous modifications, changes, variations, substitutions and equivalents will occur to those skilled in the art without departing from the spirit and scope of the present application as defined by the appended claims.

What is claimed is:

1. A multimode transmit power control loop for a power amplifier, the multimode transmit power control loop comprising:
   a feedback path wherein a feedback path signal is coupled to a feedback detection input of the power amplifier via the feedback path, the feedback path including a mode selection switch having a control input for selectively applying a different impedance circuit to the feedback path for switching in different attenuation levels, based upon the control input of the mode selection switch identifying one or more of multiple potential operating modes;
   wherein operation of the multimode transmit power control loop increases or decreases an operating level of amplified power output from the power amplifier, which is proportional to a present level of attenuation resulting from the particular impedance circuit being applied to the feedback path via the mode selection switch.

2. A multimode transmit power control loop in accordance with claim 1, wherein the feedback path signal includes a signal representative of the amplified power output of the power amplifier.

3. A multimode transmit power control loop in accordance with claim 1, wherein the feedback path signal includes a signal representative of any of the amplified power output of the power amplifier that is reflected back toward the power amplifier.

4. A multimode transmit power control loop in accordance with claim 1, wherein the feedback path includes a directional coupler, and a feedback path signal selection switch for selecting as the feedback path signal a signal representative of the amplified power output of the power amplifier and a signal representative of any of the amplified power output of the power amplifier that is reflected back toward the power amplifier.

5. A multimode transmit power control loop in accordance with claim 1, wherein at least one of the multiple potential operating modes that can be identified through the control input of the mode selection switch includes a mode identifying a wired connection to the amplified power output from the power amplifier.

6. A multimode transmit power control loop in accordance with claim 1, wherein at least one of the multiple potential operating modes that can be identified through the control input of the mode selection switch includes a mode identifying an unobstructed antenna connection to the amplified power output from the power amplifier.

7. A multimode transmit power control loop in accordance with claim 1, wherein at least one of the multiple potential operating modes that can be identified through the control input of the mode selection switch includes a mode identifying an obstructed antenna connection to the amplified power output from the power amplifier.

8. A multimode transmit power control loop in accordance with claim 1, wherein at least one of the multiple potential operating modes that can be identified through the control input of the mode selection switch includes a mode identifying a device being charged to the amplified power output from the power amplifier.

9. A multimode transmit power control loop in accordance with claim 1, wherein the mode selection switch is coupled to a circuit having a controllable variable impedance for selectively applying a different impedance circuit to the feedback path.

10. A multimode transmit power control loop in accordance with claim 1, wherein the mode selection switch is coupled to a circuit having multiple separately coupleable impedances for selectively applying a different impedance circuit to the feedback path.

11. An electronic device comprising:
a transmitter for conveying a signal, the transmitter including a power amplifier having a multimode transmit power control loop comprising a feedback path wherein a feedback path signal is coupled to a feedback detection input of the power amplifier via the feedback path, the feedback path including a mode selection switch having a control input for selectively applying a different impedance circuit to the feedback path for switching in different attenuation levels, based upon the control input of the mode selection switch identifying one or more of multiple potential operating modes;
wherein operation of the multimode transmit power control loop increases or decreases an operating level of amplified power output from the power amplifier, which is proportional to a present level of attenuation resulting from the particular impedance circuit being applied to the feedback path via the mode selection switch.

12. An electronic device in accordance with claim 11, wherein at least one of the multiple potential operating modes that can be identified through the control input of the mode selection switch includes a mode identifying a wired connection to the amplified power output from the power amplifier.

13. An electronic device in accordance with claim 11, wherein at least one of the multiple potential operating modes that can be identified through the control input of the mode selection switch includes a mode identifying an unobstructed antenna connection to the amplified power output from the power amplifier.

14. An electronic device in accordance with claim 11, wherein at least one of the multiple potential operating modes that can be identified through the control input of the mode selection switch includes a mode identifying an obstructed antenna connection to the amplified power output from the power amplifier.

15. An electronic device in accordance with claim 11, wherein at least one of the multiple potential operating modes that can be identified through the control input of the mode selection switch includes a mode identifying the electronic device being charged to the amplified power output from the power amplifier.

16. A method of adjusting a detected operating level of amplified power output from a power amplifier, the method comprising:
detecting one or more of multiple potential operating modes; and
selectively applying a different impedance circuit to a feedback path of a multimode transmit power control loop dependent upon the one or more potential operating modes detected for switching in a different attenuation level;
wherein operation of the multimode transmit power control loop increases or decreases an operating level of amplified power output from the power amplifier, which is proportional to a present level of attenuation resulting from the particular impedance circuit being applied to the feedback path via a mode selection switch.

17. A method in accordance with claim 16, wherein the multiple potential operating modes includes a wired connection mode, which can be detected.

18. A method in accordance with claim 16, wherein the multiple potential operating modes includes an unobstructed antenna connection mode, which can be detected.

19. A method in accordance with claim 16, wherein the multiple potential operating modes includes an obstructed antenna connection mode, which can be detected.

20. A method in accordance with claim 16, wherein the multiple potential operating modes includes a device charging mode, which can be detected.

* * * * *